United States Patent [19]

Todokoro

[11] 4,021,747

[45] May 3, 1977

[54] SIGNAL AMPLIFIER CIRCUIT USING A PAIR OF COMPLEMENTARY JUNCTION FIELD EFFECT TRANSISTORS

[75] Inventor: Shigeru Todokoro, Fujisawa, Japan

[73] Assignee: Tokyo Shibaura Electric Co., Ltd., Kawasaki, Japan

[22] Filed: Sept. 29, 1975

[21] Appl. No.: 617,571

[30] Foreign Application Priority Data

Oct. 29, 1974 Japan .............................. 49-123972

[52] U.S. Cl. ................................... 330/13; 330/15; 330/17; 330/18; 330/19; 330/20; 330/28; 330/35

[51] Int. Cl.² ...................................... H03F 3/185

[58] Field of Search ............... 330/13, 15, 18, 19, 330/20, 17, 28, 30 D, 35, 32

[56] References Cited

UNITED STATES PATENTS

| | | | |
|---|---|---|---|
| 3,024,422 | 3/1962 | Jansson | 330/35 UX |
| 3,163,827 | 12/1964 | Kandiah | 330/324 UX |
| 3,663,888 | 5/1972 | Greene | 330/30 D X |
| 3,862,367 | 1/1975 | Kond et al. | 330/35 X |

FOREIGN PATENTS OR APPLICATIONS

| | | | |
|---|---|---|---|
| 1,487,485 | 5/1973 | Germany | 330/30 D |
| 1,263,101 | 3/1968 | Germany | 330/30 D |

*Primary Examiner*—James B. Mullins
*Attorney, Agent, or Firm*—Oblon, Fisher, Spivak, McClelland & Maier

[57] ABSTRACT

A signal amplifier circuit includes at least one pair of complementary junction field effect transistors serially connected in a source-to-source relationship between first and second power supply source terminals. In order to apply a reverse bias between the gate and source in each of the paired transistors, the gate bias potential of one of the paired transistors can be selected between a potential on the first power supply terminal and a potential of the commonly connected sources of the transistor pair, and the gate bias potential of the other transistor be selected between a potential at the second power supply terminal and the potential of the commonly connected sources of the transistor pair. According to this invention, direct coupling can be easily effected between amplifier stages using a common power supply source.

6 Claims, 15 Drawing Figures

40 PREDRIVER CIRCUIT
30 DRIVER CIRCUIT
20 PUSHPULL OUTPUT CIRCUIT

SIGNAL AMPLIFIER CIRCUIT USING A PAIR OF COMPLEMENTARY JUNCTION FIELD EFFECT TRANSISTORS

BACKGROUND OF THE INVENTION

This invention relates to a signal amplifier circuit using junction field effect transistors.

Recently, attention has been drawn to the use, as an amplifying element for an audio signal amplifier circuit, of a vertical type junction field transistor, as disclosed in U.S. Pat. No. 3,828,230 issued on Aug. 6, 1974 to Nishizawa et al, which has the same current unsaturated characteristics as those of a triode vacuum tube. The conventional junction field effect transistor, as opposed to such a triode type junction field effect transistor, has the same current saturated characteristics as those of a pentode vacuum tube. When any of the current saturated type and current unsaturated type field effect transistor is used in a circuit, a reverse bias must be applied between the gate electrode and the source electrode of the field effect transistor. That is, in case of a p-channel transistor, the gate bias must be positive with respect to the source bias, and, in case of an n-channel transistor, the gate bias negative. In a prior art circuit, to meet this requirement, either a separate bias power source is provided in the gate circuit, or a self-bias circuit comprised of a resistor and a capacitor connected in parallel with each other is provided in the source circuit.

However, in the former method the separate bias power source must have a polarity opposite to that of the power supply source, resulting in a complicated power source circuit arrangement. In the latter method an output voltage amplitude is restricted due to a voltage drop across the self-bias circuit. This makes it unsuitable for use in an amplifier stage with a relatively great amplitude in particular. The use of a common power supply source, in either method, makes it difficult to provide a direct-coupled signal amplifier circuit in which the output of a preceding stage amplifier is direct-coupled to the input of a succeeding stage amplifier.

SUMMARY OF THE INVENTION

An object of this invention is to provide a signal amplifier circuit capable of easily reverse biasing the gate electrode of a junction field effect transistor without using any separate bias power source or self-bias circuit.

Another object of this invention is to provide a signal amplifier circuit using junction field effect transistors, which is capable of effecting a multi-stage direct-coupling using a common power supply source.

A signal amplifier circuit according to this invention is characterized in that at least one pair of complementary junction field effect transistors are serially connected in a source-to-source relationship between first and second terminals of a power supply source to provide a direct-current conductive path. In such a circuit arrangement a d.c. bias potential at the gate electrode of one of the paired transistors can be selected between a potential on the first terminal of the power supply source and a potential of the commonly connected source electrodes of the transistor pair and a d.c. bias potential at the gate electrode of the other transistor be selected between a potential on the second terminal of the power supply source and the potential of the commonly connected source electrodes of the transistor pair, thereby reverse biasing the gate electrode of the junction field effect transistor without using a separate bias power source or a self-bias circuit.

Since, according to this invention, a d.c. bias potential necessary for the gate electrode of an input transistor of a pair of complementary transistors in a succeeding amplifier can be made coincident with a d.c. voltage level on the output terminal of a preceding stage amplifier connected between a load resistor and the series connection of the paired complementary transistors, a direct-coupled signal amplifier circuit can be easily designed. Further, the bias potentials required of the gate electrodes of the paired transistors can be made coincident with each other by providing a d.c. voltage level shift circuit between the source electrodes of the paired transistors.

In the signal amplifier circuit according to this invention one of the paired transistors acts as an inverting transistor and the other as a non-inverting transistor. Consequently, negative feedback can be easily provided by coupling an output signal of the signal amplifier to the gate electrode of that transistor in the transistor pair which is not adapted to receive an input signal. The signal amplifier circuit according to this invention can be used as a differential amplifier since inverting and non-inverting transistors are provided.

Further, a push-pull signal amplifier circuit can be provided by serially connecting two pairs of complementary transistors between the power supply terminals. Since d.c. bias potentials required of the gate electrodes of a pair of input complementary transistors, each of which belongs to a different pair of complementary transistors, can be made coincident with each other, it is unnecessary to provide a gate bias circuit between the gate electrodes of input complementary transistors, thereby enabling the gate electrodes of the input complementary transistors to be directly coupled to an input circuit.

BRIEF DESCRIPTION OF THE DRAWING

This invention will be further described by way of example by referring to the accompanying drawings, in which.

DETAILED DESCRIPTION OF THE PREFERRED EMBODIMENTS

Although triode- and pentode-type junction field effect transistors may be used, singly or in combination, in a signal amplifier circuit according to this invention, description will be first made on signal amplifier circuits using the pentode-type junction field effect transistors.

Figure 1:
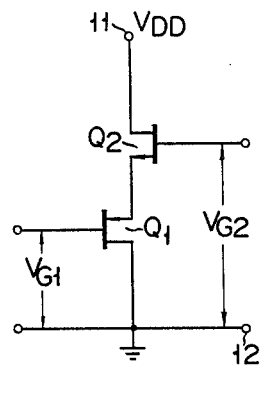
FIG. 1 is a schematic diagram showing a signal amplifier circuit according to this invention.

The signal amplifier circuit according to this invention fundamentally comprises, as shown in FIG. 1, a pair of complementary transistors, i.e. a p-channel transistor $Q_1$ and n-channel transistor $Q_2$, serially connected in a source-to-source relationship between first and second terminals or positive and negative terminals 11 and 12 of a power supply source to provide a direct current conductive path.

The operation current or drain current $I_D$ of the pentode-type transistor can approximately be expressed as follows:

$$I_D = gm(V_{Gs} + V_p) \tag{1}$$

where
 $gm$ = mutual conductance
 $V_{Gs}$ = gate-to-source voltage
 $V_p$ = pinch-off voltage It is necessary that, in order to accomplish a signal amplification, $V_{Gs}$ be varied by the signal component and d.c. bias voltage in a range between 0 and $-V_p$ i.e. the gate electrode be reverse-driven, relative to the source electrode, in a range between 0 and $V_p$.

For a basic circuit shown in FIG. 1 the following equations will be established.

$$I_{D1} = gm1(V_{Gs1} + V_{p1}) \tag{2}$$

$$I_{D2} = gm2(V_{Gs2} + V_{p2}) \tag{3}$$

$$I_{D1} = I_{D2} \tag{4}$$

$$V_{G1} = V_s + V_{Gs1} \tag{5}$$

$$V_{G2} = V_s - V_{Gs2} \tag{6}$$

where
 $I_{D1}$ = drain current of the transistor $Q_1$
 $I_{D2}$ = drain current of the transistor $Q_2$
 $gm1$ = mutual conductance of the transistor $Q_1$
 $gm2$ = mutual conductance of the transistor $Q_2$
 $V_{Gs1}$ = gate-to-source voltage of the transistor $Q_1$
 $V_{Gs2}$ = gate-to-source voltage of the transistor $Q_2$
 $V_{p1}$ = pinch-off voltage of the transistor $Q_1$
 $V_{p2}$ = pinch-off voltage of the transistor $Q_2$
 $V_{G1}$ = potential of the gate electrode of the transistor $Q_1$ with respect to a reference point (e.g. ground)
 $V_{G2}$ = potential of the gate electrode of the transistor $Q_2$ with respect to the reference point
 $V_s$ = potential of the commonly connected source electrodes in the series circuit of the transistors $Q_1$ and $Q_2$ From equations (2) to (6) the operation current $I_D$ ($= I_{D1} = I_{D2}$) of the circuit of FIG. 1 will be found as follows:

$$I_D = \frac{gm1 \cdot gm2}{gm1 + gm2} \{(V_{G2} - V_{G1}) + (V_{p1} + V_{p2})\} \tag{7}$$

Equation (7) shows that the operation current $I_D$ of the circuit of FIG. 1 is dependent upon a difference between the gate potentials $V_{G1}$ and $V_{G2}$ of the paired transistors $Q_1$ and $Q_2$, not upon $V_{Gs1}$ and $V_{Gs2}$. For signal amplification, $V_{G2} - V_{G1}$ should be in a range between 0 and $-(V_{p1} + V_{p2})$. This means that, even if both $V_{G1}$ and $V_{G2}$ are both positive, it will be sufficient if $V_{G2} - V_{G1}$ is negative. That is, to make $V_{G2} - V_{G1}$ negative the gate bias potential $V_{G1}$ of the transistor $Q_1$ in FIG. 1 can be selected between the source potential $V_s$ and the first terminal potential $+V_{DD}$ of the power supply source and the gate bias potential $V_{G2}$ of the transistor $Q_2$ be selected between the source potential $V_s$ and the second terminal potential — ground potential for a signal power source system or $-V_{DD}$ for a two power source system — of the power supply source. In other words, according to this invention reverse bias voltages can be applied to the gate electrodes of the transistors, without the necessity of using any separate bias power source or self-bias circuit, simply by establishing each gate electrode of the paired complementary transistors at a suitable potential across the power source.

As can be easily realized in an integrated circuit, when the transistors $Q_1$ and $Q_2$ have the same mutual conductance gm and the same pinch-off voltage $V_p$ the above-mentioned equation (7) can be rewritten as follows:

$$I_D = \frac{gm}{2} \{(V_{G2} - V_{G1}) + 2V_p\} \tag{8}$$

As will be evident from a comparison between equations (1) and (8) the pair of complementary transistors according to this invention will have one half the mutual conductance of its single element and two times the pinch-off voltage of its single element.

As mentioned above, the dependence of the operation current of the complementary pair upon the gate difference voltage $V_{G2} - V_{G1}$ means that the gate bias voltage of one of the complementary pair can be selected according to a set gate bias voltage of the other transistor. For this reason, the gate bias value of an input transistor in a succeeding stage amplifier can be made coincident with a d.c. voltage level on the output terminal of the preceding stage amplifier, permitting a direct-coupled amplifier circuit arrangement.

For the signal amplifier circuit according to this invention either one or both of the gate electrodes of the paired complementary transistors can be utilized as a signal input terminal, and either one or both of the drain electrodes thereof as a signal output terminal. The outputs of the drain electrodes of the paired complementary transistors are opposite in phase to each other.

Figure 2:
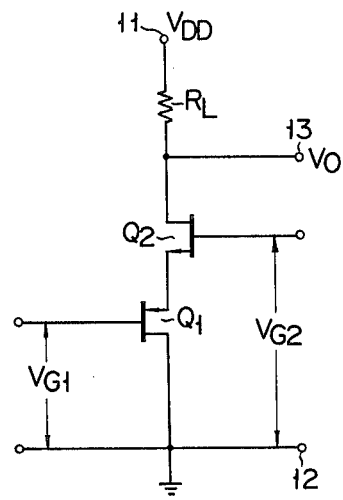
FIG. 2 is a schematic diagram showing a signal amplifier circuit according to one embodiment of this invention.

In a signal amplifier circuit, as shown in FIG. 2, in which a load resistor $R_L$ is connected between the drain electrode of the transistor $Q_2$ and the first supply terminal 11 and an output terminal 13 is connected to the drain electrode of the transistor $Q_2$, an output voltage $V_0$ taken from the output terminal 13 is $V_{DD} - I_D R_L$.

A voltage gain $G_1$ of the circuit of FIG. 2 with respect to the gate voltage $V_{G1}$ of the first transistor $Q_1$ will be $$G_1 = \frac{dV_0}{dV_{G1}} = \frac{gm1 \cdot gm2}{gm1 + gm2} \cdot R_L \tag{9}$$

On the other hand, a voltage gain $G_2$ with respect to the gate voltage $V_{G2}$ of the second transistor $Q_2$ will be $$G_2 = \frac{dV_0}{dV_{G2}} = -\frac{gm1 \cdot gm2}{gm1 + gm2} \cdot R_L \quad (10)$$

The fact that the signs of the voltage gains $G_1$ and $G_2$ are opposite to each other means that the first transistor $Q_1$ acts as a non-inverting transistor and the second transistor $Q_2$ as an inverting transistor. This is very advantageous to provide negative feedback.

Figure 3A:
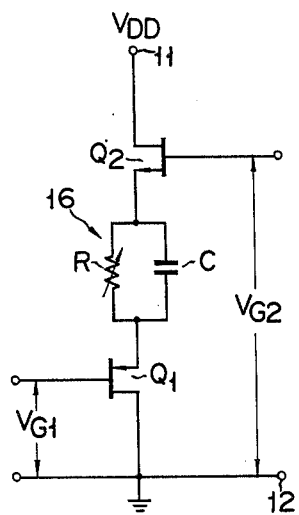
FIGS. 3A and 3B, each, are a schematic diagram showing a signal amplifier circuit according to another embodiment of this invention.
Figure 3B:
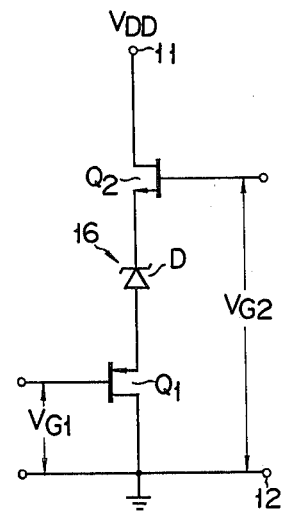

In the signal amplifier circuit according to this invention, as mentioned above, the gate of one of the paired complementary transistors $Q_1$, $Q_2$ is biased positive with respect to the commonly connected source electrodes of the transistors $Q_1$ and $Q_2$, and the gate electrode of the other transistor is biased negative with respect to the sources. If, therefore, a d.c. voltage level shift circuit 16 is connected, as shown in FIGS. 3A and 3B, between the source eletrodes of the paired transistors $Q_1$ and $Q_2$, it is possible to make the d.c. bias values for the gate electrodes of both the transistors coincident with each other. The d.c. voltage level shift circuit 16 shown in FIG. 3A includes a parallel circuit of a resistor R and capacitor C. The resistor R may be of a variable type as shown. In FIG. 3B the d.c. voltage level shift circuit 16 may comprise a diode D such as an ordinary diode, Zener diode or light emitting diode.

Figure 4:
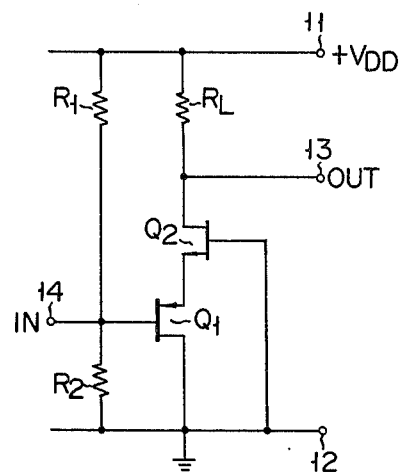
FIGS. 4 and 5, each, are a schematic diagram showing a signal amplifier circuit according to this invention which includes bias circuits.

FIG. 4 is a signal amplifier circuit according to one embodiment of this invention. In this embodiment, the gate electrode of the input transistor $Q_1$ which is connected to an input terminal 14 is connected to a junction of resistors $R_1$ and $R_2$ in a fixed bias circuit connected between the first and second terminals 11 and 12 of the power source. On the other hand, the gate electrode of the second transistor $Q_2$ is direct connected to the second terminal of the power source or ground. An output terminal 13 is connected between the drain of the second transistor $Q_2$ and a load resistor $R_L$.

In the signal amplifier circuit shown in FIG. 4 a reverse bias is applied between the source and gate electrodes of transistor $Q_2$ until the source-to-drain voltage of transistor $Q_1$ becomes zero by an input signal applied to the input terminal 14. When the source-to-drain voltage of transistor $Q_1$ becomes zero, the voltage $V_{Gs}$ of the transistor $Q_2$ becomes zero. As a consequence, the transistor $Q_2$ is in a maximum current flowing state. At this time, the output terminal 13 becomes substantially zero volt. That is, an output having an amplitude in a range between substantially zero and $+V_{DD}$ can be derived from the amplifier circuit shown in FIG. 4. In practice, however, the source-to-drain voltage of the transistor $Q_1$ is not dropped beyond its saturation voltage and, therefore, the voltage $V_{Gs}$ of the transistor $Q_2$ does not become zero. In consequence, the lowest level of the output voltage $V_0$ is somewhat higher than a zero level. In order to cause the lowest level of the output voltage $V_0$ to come closer to the zero level, the gate electrode of the transistor $Q_2$ is preferred to be biased, by resistors $R_3$ and $R_4$, to the saturation voltage of the transistor $Q_1$ as shown in FIG. 5 and thus, when the transistor $Q_1$ is driven, by an input signal voltage, into saturation, the voltage $V_{Gs}$ of the transistor $Q_2$ can become zero.

Figure 5:
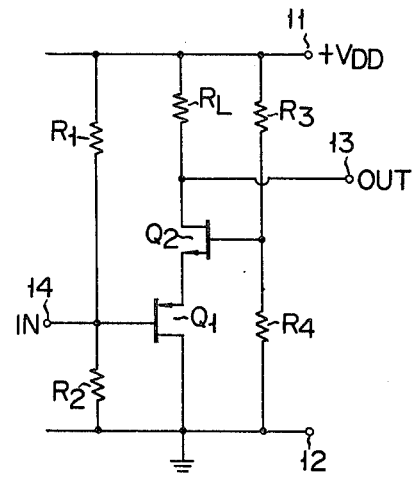

Since the signal amplifier circuit as shown in FIGS. 4 and 5 does not use any self-bias circuit, an output signal with a peak-to-peak amplitude substantially equal to a power source voltage will be able to be derived at the maximum output state.

Figure 6:
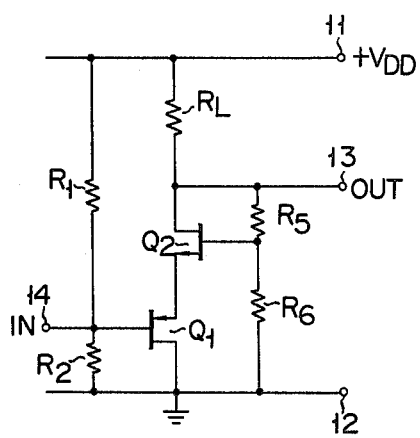
FIGS. 6 and 7, each, are a schematic diagram according to this invention which includes negative feedback.

FIG. 6 is a signal amplifier circuit according to another embodiment of this invention. As mentioned above, the drain output signal of the transistor $Q_2$ is in phase with the gate input signal of the transistor $Q_1$ and 180° out-of-phase with the gate input signal of the transistor $Q_2$. The signal amplifier circuit with negative feedback can be constituted by connecting as shown in FIG. 6 a voltage divider, including resistors $R_5$ and $R_6$, between the output terminal 13 and the second terminal 12 of the power source and connecting a dividing point between the resistors $R_5$ and $R_6$ to the gate electrode of the transistor $Q_2$ i.e. feeding an output signal back to an inverting input or the gate electrode of the transistor $Q_2$.

Figure 7:
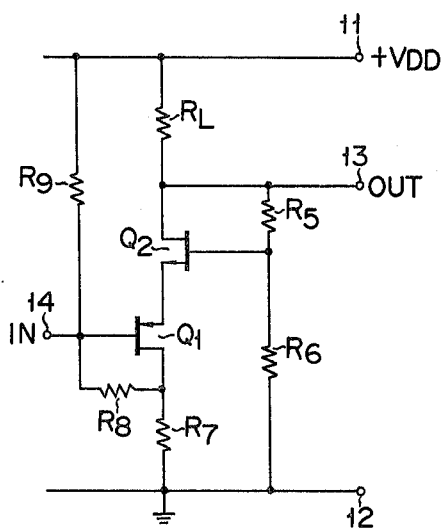

FIG. 7 shows a modified version of the signal amplifier circuit of FIG. 6. In the modification a negative feedback signal is also applied to the gate electrode of the transistor $Q_1$ by connecting a resistor $R_7$ between the drain electrode of the transistor $Q_1$ and the second terminal 12 of the power source, a feedback resistor $R_8$ between the gate and drain electrodes of the transistor $Q_1$ and a resistor $R_9$ between the gate electrode of the transistor $Q_1$ and the first terminal 11 of the power source.

Figure 8:
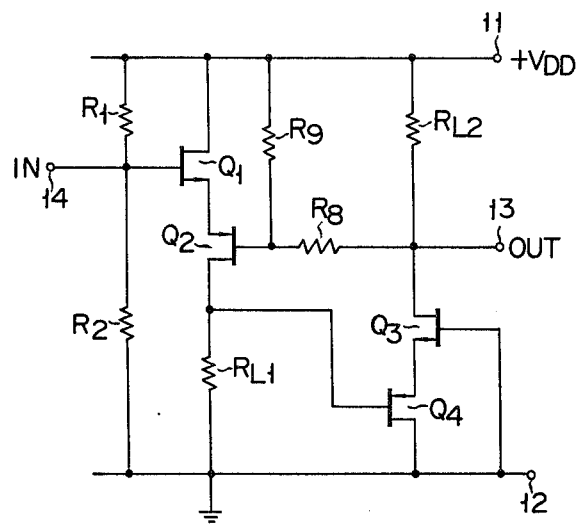
FIGS. 8 and 9 show direct-coupled type signal amplifier circuits according to this invention, each of which includes negative feedback.

With a direct-coupled amplifier circuit as shown in FIG. 8, negative feedback can be provided by feeding the output signal of a succeeding stage amplifier back to the gate of the inverting transistor $Q_2$ in the preceding stage amplifier. In FIG. 8 the output signal of the succeeding stage amplifier of the type, as shown in FIG. 4, including a pair of complementary transistors $Q_3$, $Q_4$ and load resistor $R_{L2}$ is fed, through a divider including resistors $R_8$ and $R_9$, back to the gate electrode of the inverting transistor $Q_2$ in the preceding stage amplifier including the paired complementary transistors $Q_1$ and $Q_2$ and load resistor $R_{L1}$. It will be understood that the output signal of the succeeding stage amplifier is in phase with the input signal applied to the gate of the non-inverting transistor $Q_1$ in the preceding stage amplifier.

Figure 9:
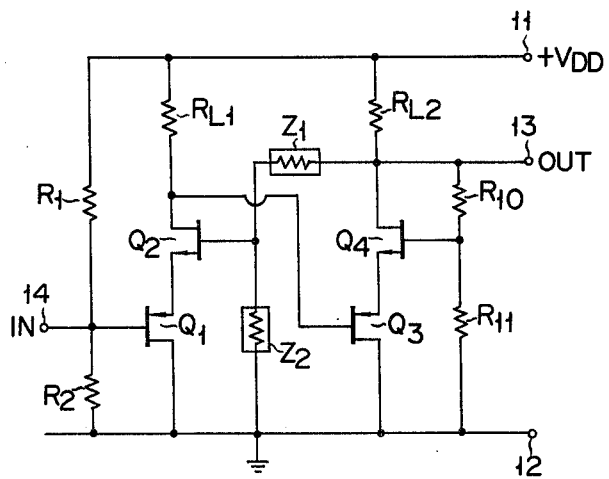

FIG. 9 shows a direct-coupled signal amplifier circuit with negative feedback. In this signal amplifier circuit, negative feedback is provided to the succeeding stage amplifier by applying to the gate electrode of the inverting transistor $Q_4$ the output of a divider including resistors $R_{10}$ and $R_{11}$ and connected between the output terminal 13 and the second terminal 12 of the power source, and negative feedback is also provided to the preceding stage amplifier by applying to the gate electrode of the inverting transistor $Q_2$ the output of a divider including impedance elements $Z_1$ and $Z_2$ connected between the output terminal 13 of the succeeding stage amplifier and the second terminal 12 of the power source. As the feedback point i.e. the gate electrode of the transistor $Q_2$ in the preceding stage amplifier may take a high impedance, the feedback impedance elements $Z_1$ and $Z_2$ permits the use of a high impedance element, for example, a small value capacitor. This circuit is suitable for an equalizer circuit etc.

Since, as mentioned above, one of the paired complementary transistors in the signal amplifier circuit according to this invention acts as an inverting transistor and the other as a non-inverting transistor, the signal amplifier circuit according to this invention can be utilized not only as an in-phase amplifier, but also as a phase reversal amplifier (phase inverter), phase splitter, differential amplifier etc.

Figure 10A:
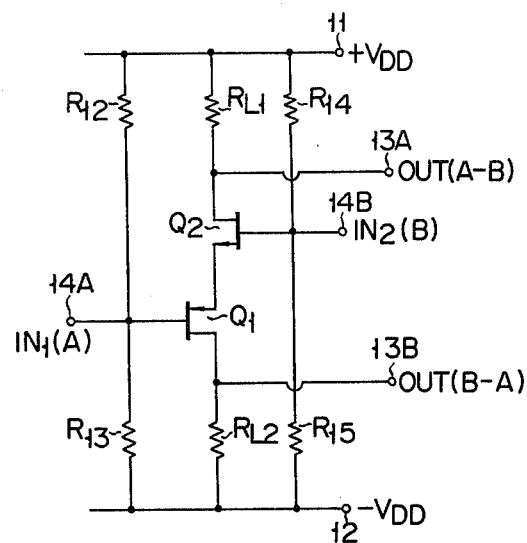
FIGS. 10A and 10B are schematic diagrams each showing a differential amplifier according to this invention.

FIG. 10A shows an example of such a differential amplifier. In this amplifier circuit the drain of the transistor $Q_2$ is connected through a first load resistor $R_{L1}$ to a positive terminal 11 of a two power source system, and the drain electrode of the transistor $Q_1$ is connected to the negative terminal 12 of the two power source system through a second load resistor $R_{L2}$ having the same value as that of the first load resistor $R_{L1}$. A predetermined value of bias voltage is applied by resistors $R_{12}$ and $R_{13}$ to the gate electrode of the transistor $Q_1$, and a predetermined value of bias voltage is applied by resistors $R_{14}$ and $R_{15}$ to the gate electrode of the transistor $Q_2$. A first output terminal 13A is connected to the drain electrode of the second transistor $Q_2$, and a second output terminal 13B to the drain electrode of the first transistor $Q_1$. When a first input signal A is applied to the gate electrode of the transistor $Q_1$ and a second input signal B to the gate electrode of the transistor $Q_2$, a first differential output signal (A − B) is derived from the first output terminal 13A and a second differential output signal (B − A), opposite in phase to the first differential output signal (A − B), is derived from the second output terminal 13B.

This differential amplifier is simpler in circuit arrangement than a conventional differential amplifier, since it obviates the necessity of providing a constant current source. Furthermore it has the advantage that the d.c. level of both the output signals is symmetrical with respect to the midpoint of the two power source system and that a d.c. level difference between both the output signals is great. Either one of the first and second output terminals in the above-mentioned signal amplifier circuit may of course be omitted. If one of the input terminals in the signal amplifier circuit is omitted, the signal amplifier circuit can be utilized as a phase splitter circuit.

Figure 10B:
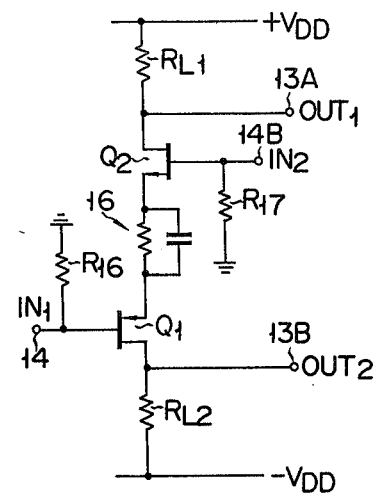

With the differential amplifier circuit arrangement in FIG. 10A a d.c. bias voltage level difference exists between gate electrodes of the transistors $Q_1$ and $Q_2$. This effect appears at both the outputs of the signal amplifier circuit. If, as mentioned above, a d.c. voltage level shift circuit 16 is connected between the source electrodes of the transistors $Q_1$ and $Q_2$, it is possible to make the gate bias voltage of the transistors $Q_1$ and $Q_2$ equal to each other. With positive and negative power sources being used as shown in FIG. 10B, the potentials of both the inputs in the signal amplifier circuit can be made at ground level by connecting the gates of the transistors $Q_1$ and $Q_2$, respectively through resistors $R_{16}$ and $R_{17}$, to ground. This is advantageous to the differential amplifier.

Figure 11A:
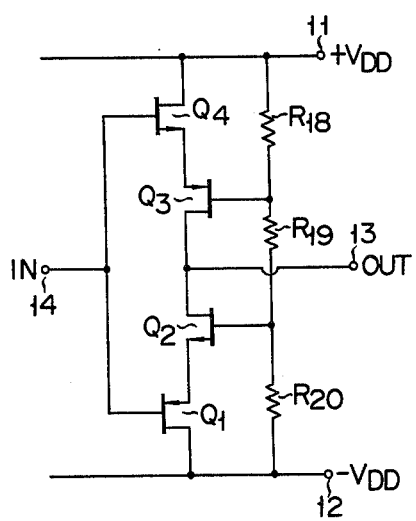
FIGS. 11A and 11B are schematic diagrams each showing a push-pull circuit according to this invention.
Figure 11B:
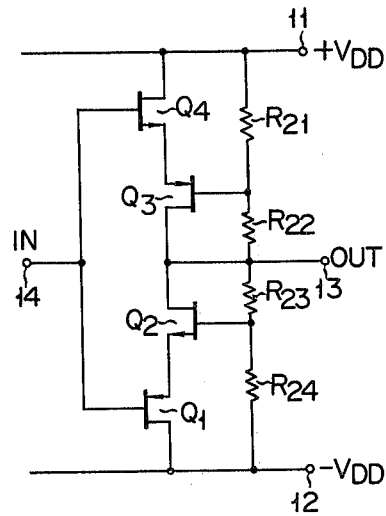

FIGS. 11A and 11B, each, show a push-pull amplifier circuit according to this invention. The amplifier circuit includes two pairs of complementary transistors $Q_1$, $Q_2$ and $Q_3$, $Q_4$, each pair of which are serially connected between a positive terminal 11 and negative terminal 12 of a two power source system, i.e. a positive and a negative power supply source, with the transistors in each pair being connected in a source-to-source relationship. In FIG. 11A, the n-channel transistor $Q_2$ and p-channel transistor $Q_3$ are connected between the p-channel transistor $Q_1$ and n-channel transistor $Q_4$, and each gate electrode of the transistors $Q_2$ and $Q_3$ is appropriately biased by a fixed bias circuit including resistors $R_{18}$ to $R_{20}$. An output terminal 13 is connected to the drain electrodes of the transistors $Q_2$ and $Q_3$, and an input terminal 14 is connected in common to the gate electrodes of the transistors $Q_1$ and $Q_4$. Since in the amplifier circuit of FIG. 11A a voltage drop, i.e. the drain-to-source voltage of the transistor $Q_2$, such as to reverse bias the gate electrode of the transistor $Q_1$ is present between the source electrode of the transistor $Q_1$ and the output terminal 13 and a voltage drop, i.e. the drain-to-source voltage of the transistor $Q_3$, such as to reverse bias the gate electrode of the transistor $Q_4$ is present between the output terminal 13 and the source of the transistor $Q_4$, the gate electrodes of the transistors $Q_1$ and $Q_4$ can be connected in common to the input terminal 14. A d.c. voltage level on the output terminal 13 and on the input terminal 14 can be made equal to each other by dependence upon the magnitudes of the drain-to-source voltages of the transistors $Q_2$ and $Q_3$.

The push-pull amplifier circuit of FIG. 11A is operated in the same way as the conventional push-pull circuit. The transistors $Q_1$ and $Q_4$ are alternatively driven by an input signal applied to the input terminal 14 and a push-pull output is derived from the output terminal 13. While the push-pull circuit is suitable as an output stage for driving a speaker, it can also be utilized for small signal amplification. Since the d.c. potentials of the input and output can be made at the same level, direct-coupling between amplifier stages can be easily accomplished. Negative feedback can be provided by connecting, as shown in FIG. 11B, the output terminal 13 to a midpoint of a fixed bias circuit for the transistors $Q_2$ and $Q_3$ which includes resistors $R_{21}$ to $R_{24}$.

Figure 12:
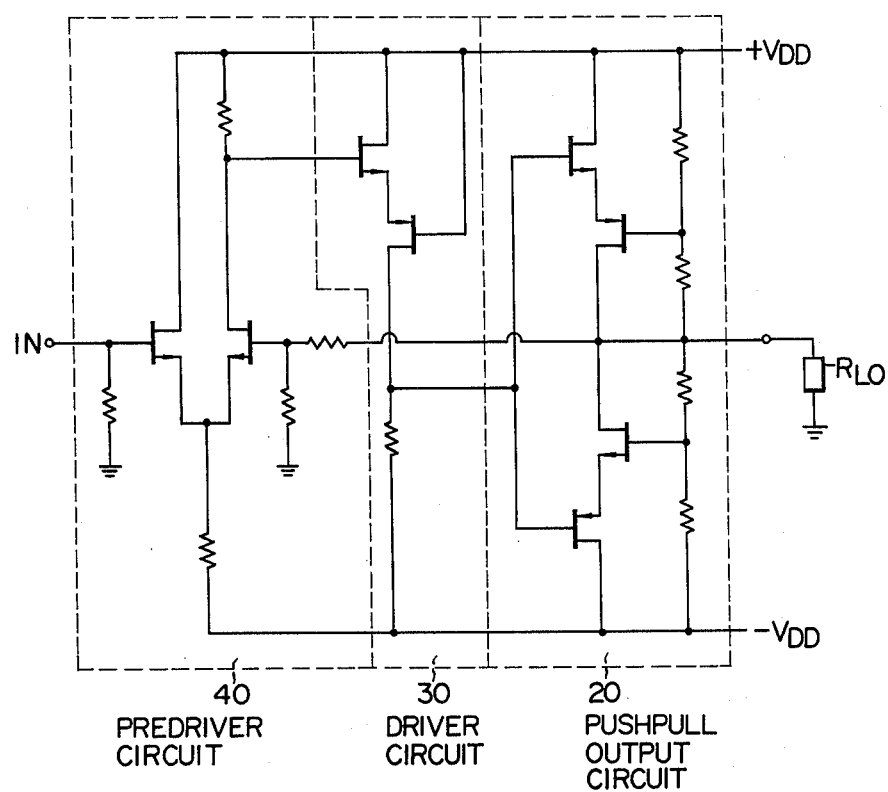
FIG. 12 is a schematic diagram showing a direct-coupled type audio signal amplifier circuit according to this invention.

FIG. 12 shows an audio signal amplifier circuit including the signal amplifier circuit according to this invention. An output stage 20 is composed of a push-pull output circuit as shown in FIG. 11B and the output of the output stage 20 is grounded through a load $R_{L0}$ such as a voice coil of a speaker. Each gate electrode of a pair of input transistors in the push-pull circuit 20 is direct-coupled to the output of a driver circuit 30 including a pair of complementary transistors according to this invention. The input of the driver circuit 30 is direct-coupled to a predriver circuit 40 comprising a differential amplifier. Negative feedback is provided to the predriver circuit 40 by feeding the output of the push-pull circuit 20 back to the gate electrode of one of transistors in the differential amplifier 40. The use of the push-pull circuit according to this invention eliminates the need for using a constant voltage element or circuit for applying a d.c. potential difference to between the gate electrodes of the paired complementary input transistors in the push-pull circuit. As such a predriver circuit 40 use may be made of the differential amplifier as shown in FIGS. 10A and 10B.

The signal amplifier circuit according to this invention can use triode type (i.e. current unsaturated type) junction field effect transistors. In this case, the following equations (11), (12), (13), (14) and (15) can be given below, corresponding to equations (1), (7), (8), (9) and (10), respectively.

$$I_D = gm\left(V_{Gs} + \frac{V_{Ds}}{\mu}\right) = \frac{\mu V_{Gs} + V_{Ds}}{rp} \quad (11)$$

-continued $$I_D = gm1 \cdot gm2 \left\{ \left(1 + \frac{1}{\mu 1}\right) V_{G2} - \left(1 + \frac{1}{\mu 2}\right) V_{G1} + \left(1 + \frac{1}{\mu 2}\right) \frac{V_D}{\mu 2} \right\} (12)$$

$$I_D = \frac{gm}{2} \left\{ (V_{G2} - V_{G1}) + \frac{V_D}{\mu} \right\} (13)$$

$$G_1 = \frac{dV_D}{dV_{G1}} = \frac{\mu 1 (1 + \mu 2) R_L}{rp2(1 + \mu 1) + rp1(1 + \mu 2) + R_L(1 + \mu 1)} \quad (14)$$

$$G_2 = \frac{-\mu 2 (1 + \mu 1) R_L}{rp2(1 + \mu 1) + rp1(1 + \mu 2) + R_L(1 + \mu 1)} \quad (15)$$

where
 $\mu 1$ = amplification factor of the transistor $Q_1$
 $\mu 2$ = amplification factor of the transistor $Q_2$
 $rp1$ = internal resistance of the transistor $Q_1$
 $rp2$ = internal resistance of the transistor $Q_2$
As will be evident from equation (13) if the triode type transistors $Q_1$ and $Q_2$ have the same characteristics, $V_{Gs}$ in equation (11) is replaced by $V_{G2} - V_{G1}$. $V_{G2} - V_{G1}$ should be in a range between 0 and $-V_D/\mu$.

This invention permits the use of a combination of a triode type and pentode type junction field effect transistor. The characteristic of the combination circuit will be easily surmised from the individual characteristic of the triode type and the pentode type field effect transistor.

What is claimed is:
1. A signal amplifier circuit comprising:
first and second junction field effect transistors of different channel types each having a drain electrode, source electrode and gate electrode;
third and fourth junction field effect transistors of different channel types each having a drain electrode, source electrode and gate electrode;
power supply means having first and second terminals;
output means for deriving an output signal;
means for serially coupling said first and second transistors in a source-to-source relationship between said output means and said first terminal of said power supply means;
means for serially coupling said third and fourth transistors in a source-to-source relationship between said output means and said second terminal of said power supply means and in such a manner that said second and third transistors are connected between said first and fourth transistors different in channel type from each other;
biasing means coupled between said first and second terminals of said power supply means to provide a potential between first and second potentials on said first and second terminals of said power supply means to the gate electrode of each of said second and third transistors; and
input means for applying an input signal to the gate electrodes of said first and fourth transistors.

2. A signal amplifier circuit according to claim 1 further including means for coupling said output means to the gate electrode of each of said second and third transistors.

3. A signal amplifier circuit comprising:
an amplifier input to receive an input signal to be amplified;
an amplifier output to derive an amplified signal therefrom;
a first power supply terminal for applying a first D.C. electrical potential;
a second power supply terminal for applying a second D.C. electrical potential;
a complementary pair of first and second junction field effect transistors coupled in series in a source-to-source relationship between said first power supply terminal and said second power supply terminal, the gate electrode of said first transistor being coupled to said amplifier input;
a first load impedance means coupled between said second transistor and said second power supply terminal;
a complementary pair of third and fourth junction field effect transistors coupled in series in a source-to-source relationship between said first and second power supply terminals, said fourth transistor being complementary to said first transistor, the gate electrode of said fourth transistor being coupled to the junction of said second transistor and said first load impedance means, and the drain electrode of said third transistor being coupled to said amplifier output;
a second load impedance means coupled between said third transistor and said first power supply terminal; and
biasing means coupled to said first and second power supply terminals for applying a D.C. potential to the gate electrode of each of said first, second and third transistors.

4. A signal amplifier circuit according to claim 3 wherein the drain electrode of said third transistor is coupled to the gate electrode of said second transistor to provide a negative feedback.

5. A signal amplifier circuit comprising:
an amplifier input to receive an input signal to be amplified;
an amplifier output to derive an amplified signal therefrom;
a first power supply terminal for applying a first D.C. electrical potential;
a second power supply terminal for applying a second D.C. electrical potential;
a complementary pair of first and second junction field effect transistors coupled in series in a source-to-source relationship between said first power supply terminal and said second power supply terminal, the gate electrode of said first transistor being coupled to said amplifier input;

a first load impendance means coupled between said second transistor and said first power supply terminal;

a complementary pair of third and fourth junction field effect transistors coupled in series in source-to-source relationship between said first and second power supply terminals, said third transistor being complementary to said second transistor, the gate electrode of said third transistor being coupled to the junction of said second transistor and said first load impedance means, and the drain electrode of said fourth transistor being coupled to said amplifier output;

a second load impedance means coupled between said fourth transistor and said first power supply terminal; and biasing means coupled to said first and second power supply terminals for applying a D.C. potential to the gate electrode of each of said first, second and fourth transistors.

6. A signal amplifier circuit according to claim 5 wherein the drain electrode of said fourth transistor is coupled to the gate electrode of said second transistor to provide a negative feedback.

* * * * *